United States Patent [19]

Yoshikawa

[11] Patent Number: 5,444,655
[45] Date of Patent: Aug. 22, 1995

[54] NON-VOLATILE SEMICONDUCTOR MEMORY DEVICE WITH A SMALL DISTRIBUTION WIDTH OF CELL TRANSISTOR THRESHOLD VOLTAGE AFTER ERASING DATA

[75] Inventor: Kuniyoshi Yoshikawa, Tokyo, Japan

[73] Assignee: Kabushiki Kaisha Toshiba, Kawasaki, Japan

[21] Appl. No.: 243,901

[22] Filed: May 17, 1994

[30] Foreign Application Priority Data

May 19, 1993 [JP] Japan .................................. 5-117098

[51] Int. Cl.⁶ .............................................. G11C 7/00
[52] U.S. Cl. ................... 365/185; 365/189.09; 365/218
[58] Field of Search .............. 365/185, 218, 189.01, 365/189.11, 189.09

[56] References Cited

U.S. PATENT DOCUMENTS

| | | | |
|---|---|---|---|
| 4,794,564 | 12/1988 | Watanabe | 365/185 |
| 5,119,330 | 6/1992 | Tanagawa | 365/185 X |
| 5,122,985 | 6/1992 | Santin | 365/185 |
| 5,283,758 | 2/1994 | Nakayama et al. | 365/218 |
| 5,295,105 | 3/1994 | Atsumi | 365/218 |

OTHER PUBLICATIONS

Nikkei Microdevices, *Nasir Bilal,* 1992.6. pp. 72–73.

*Primary Examiner*—Joseph A. Popek
*Assistant Examiner*—Son Dinh
*Attorney, Agent, or Firm*—Banner & Allegretti, Ltd.

[57] ABSTRACT

A semiconductor memory device includes a silicon chip, a memory cell transistor formed in the chip, a charge pump circuit formed in the chip, for boosting a source potential to generate a boosted potential, and a switching circuit formed in the chip. The switching circuit switches the portions to which the boosted voltage is supplied, depending on whether data is being written or erased. When writing data, the boosted potential is led to a drain of the memory cell transistor. When erasing data, the boosted potential is led to a source of the memory cell transistor.

11 Claims, 5 Drawing Sheets

NON-VOLATILE SEMICONDUCTOR MEMORY DEVICE WITH A SMALL DISTRIBUTION WIDTH OF CELL TRANSISTOR THRESHOLD VOLTAGE AFTER ERASING DATA

BACKGROUND OF THE INVENTION

1. Field of the Invention

The present invention relates to a non-volatile semiconductor memory device, and particularly, to a non-volatile semiconductor memory device capable of electrically writing and erasing data.

2. Description of the Related Art

Recently, in the field of non-volatile semiconductor memory devices, a flash EEPROM which uses hot electron injection for writing and flash erasing (tunnel-current) for erasing has become important. Since a flash EEPROM uses a memory transistor which can be constituted by one single transistor, the cell size of this kind of flash EEPROM can be smaller, the capacity thereof can be easily enlarged in the future, costs thereof can be greatly reduced, and a flash EEPROM can substitute for a magnetic memory, such as a floppy disk.

Figure 1:
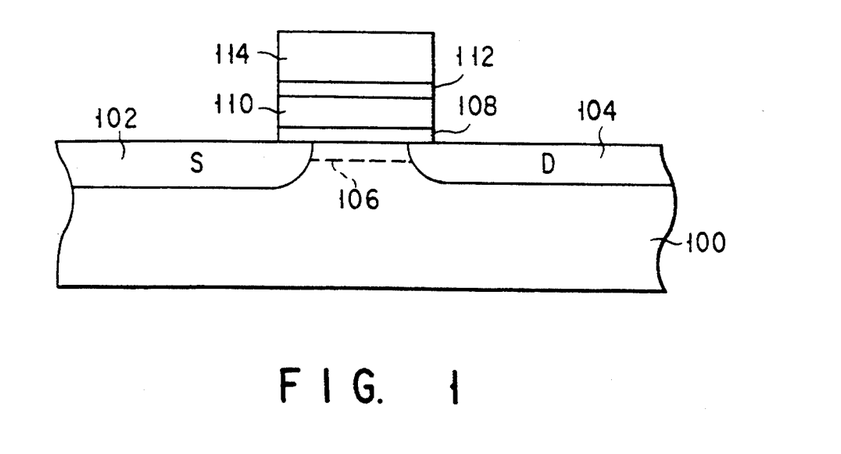
FIG. 1 is a cross-section showing a typical memory cell transistor.
Figure 2A:
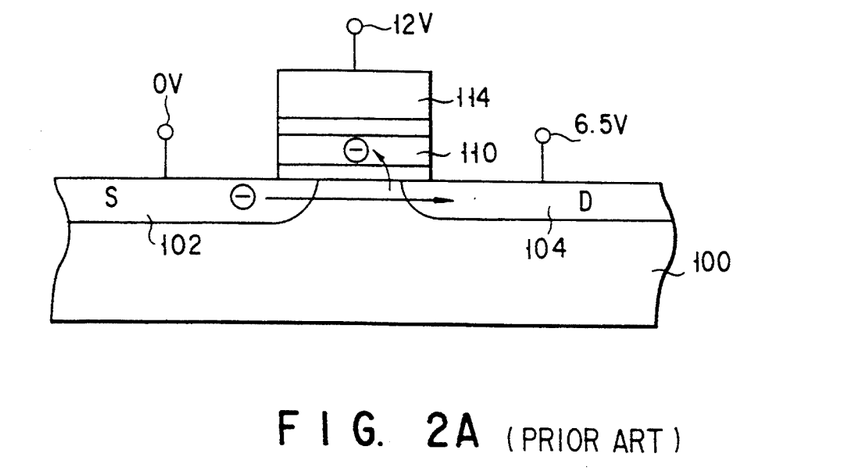
FIG. 2A is a view showing a state of a conventional writing operation of a memory cell transistor.
Figure 2B:
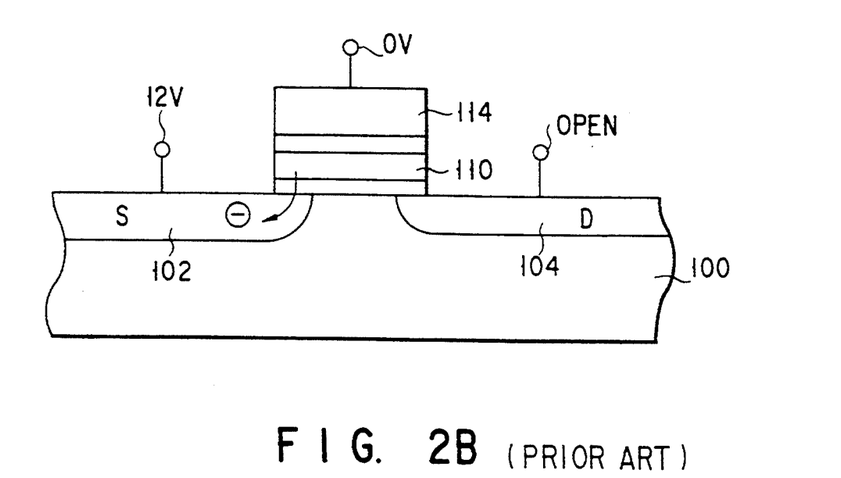
FIG. 2B is a view showing a state of a conventional erasing operation of a memory cell transistor.

FIG. 1 is a cross-sectional view showing a typical memory cell transistor included in a flash EEPROM. FIGS. 2A and 2B are views showing an operating condition of a conventional memory cell transistor. FIG. 2A shows a writing operation while FIG. 2B shows an erasing operation.

At first, as shown in FIG. 1, a source 102 and a drain 104 are formed in a silicon substrate 100. A first gate oxide film 108 is formed on a channel 106 positioned between the source 102 and the drain 104. A floating gate 110 is formed on the first gate oxide film 108, and a second gate oxide film 112 is formed on the floating gate 110.

In an ordinary flash memory having of a structure as stated above, an operating source voltage VCC (e.g. 5 V) and an erasing power source voltage VPP (e.g. 12 V) are required and this memory thus cannot operate using only a single operating power source, i.e., the source voltage VCC.

Specifically, a drain bias Vd and a gate bias Vg are respectively applied to the drain 104 and the control gate 114 so that a current flows between the drain 104 and the source 102 of the cell transistor to efficiently generate hot electrons near the drain 104. A portion of hot electrons thus generated is injected into the floating gate 110. In order to efficiently generate hot electrons and to complete a writing operation within a time period which is suitable for practical use, the drain bias Vd and the gate bias Vg must be set to voltages higher than an ordinary power source voltage VCC. For example, in case of a memory having a capacity equivalent to 1 megabit, the gate bias Vg, drain bias Vd, and source bias Vs are respectively set to 12 V, 6.5 V, and 0 V, as shown in FIG. 2A. In addition the chip has an operating source voltage VCC of 5 V.

Meanwhile, in an erasing operation, a source bias VS and a voltage of 0 V are respectively applied to the source and the control gate, with the drain kept opened, to eject electrons from the floating gate. This source bias Vs must be set to be higher than the source voltage VCC. For example, the source bias Vs of 12 V is used in conventional cases, as shown in FIG. 2B.

In a writing operation, a current of 0.5 mA is required per one memory transistor element, and for example, a current of 16 mA must be supplied when data is simultaneously written into 32 pieces of cell transistors.

In addition, since a high voltage is applied to the source, a leakage current generated by a band-to-band tunneling phenomena flows and this current amounts to 10 nA per unit cell, so that a large source current thereby flows. For example, a current of approximately 20 mA is required to block-erase data of 2 megabit cell transistors.

In order to realize operation using a single power source, there is a method in which a charge pump circuit is fabricated on a chip. However, in order to boost a source voltage VCC to a source bias Vs of 12 V in an erasing operation and to simultaneously supply a large current, a large area is required for a capacitor and this necessitates an enlargement of the chip size. For example, in case of using a charge pump circuit arranged in two stages, a capacitor having a size of 1.5 mm square is required when an oxide film having a film thickness of 30 nm is used to create a voltage of 12 V from a power source of 4.5 V. In this case, the chip size is therefore extremely large and is not suitable for practical use.

Presently, a DC-DC converter used only for boosting voltages is provided outside the chip to overcome the situation stated above.

As an attempt to realize operation using a single power source, there is a method of using a negative gate voltage when erasing data, to attain a gate bias Vg of $-10$ V and a source bias Vs equal to a source voltage of VCC.

Figure 3A:
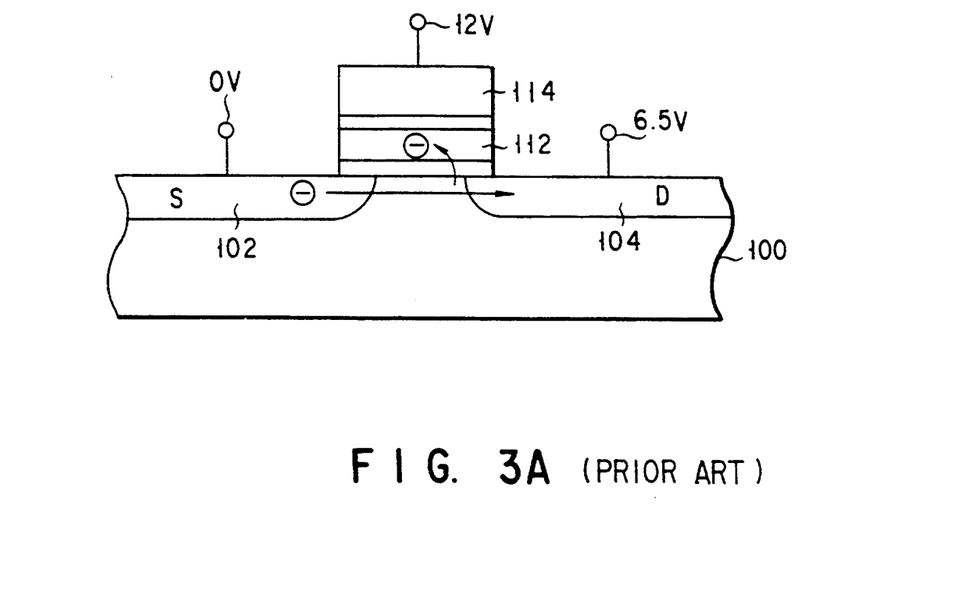
FIG. 3A is a view showing a state of another conventional writing operation of a memory cell transistor.
Figure 3B:
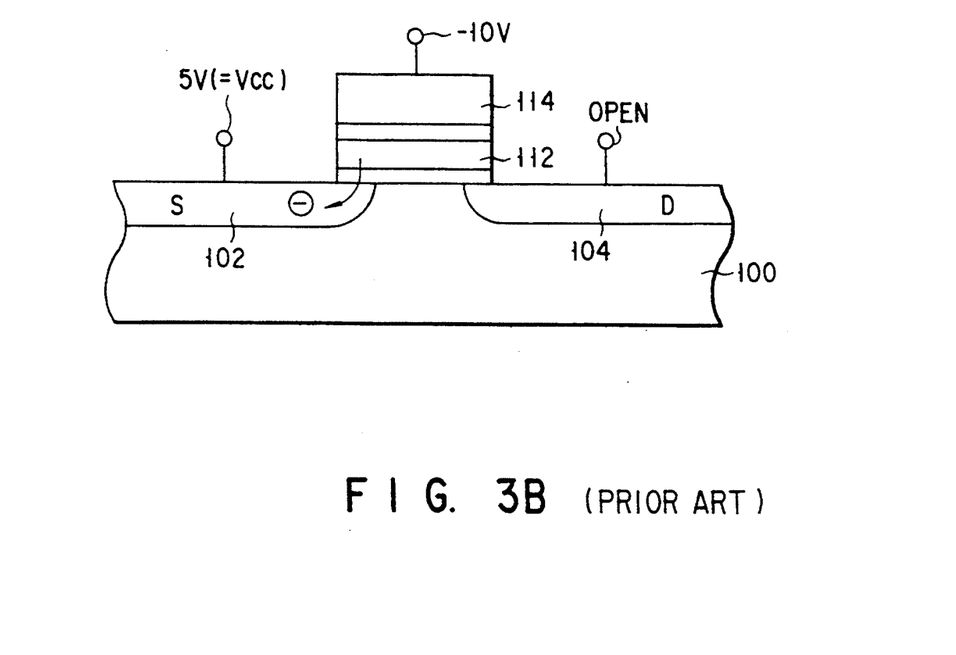
FIG. 3B is a view showing a state of another conventional erasing operation of a memory cell transistor.

FIGS. 3A and 3B are views showing operation of this kind of memory. FIG. 3A shows a state during a writing operation, and FIG. 3B shows a state in an erasing operation.

In these cases, a drain bias Vd of about 6.5 V required for writing data can be obtained simply by providing a charge pump circuit which boosts the source voltage VCC to a voltage equivalent to the drain bias. A time period required for the boosting is shortened and an area occupied by the capacitor can be reduced to be small.

However, in this method, since another source bias Vs required for erasing data is equal to the source voltage VCC (4.5 to 5 V), variation of the source voltage easily influences the source bias in erasing, and this results in a problem that the cell threshold voltage distribution after erasing data increases and leads to a disadvantage that the manufacturing yield and operation margin are degraded.

SUMMARY OF THE INVENTION

The object of the present invention is to provide a non-volatile semiconductor memory device in which an area occupied by a chip is reduced and a distribution width of the threshold voltage of cell transistors in the memory array after erasing data is reduced.

In order to achieve the above object, according to the present invention, a non-volatile semiconductor memory device comprises: a semiconductor chip; memory cell transistors provided in the chip, each memory cell transistor having a gate insulating film in which a charge store layer is included for controlling a threshold voltage; a generation circuit provided in the chip, for boosting a source potential to generate a boosted potential; and a switching circuit provided in the chip, for switching destination portions to which the boosted potential is supplied, such that the boosted potential is led to a drain of the memory cell transistor from the generation means when writing data and the boosted potential is led to a source of the memory cell transistor from the generation means when erasing data.

In the semiconductor memory device having a structure as stated above, since a switching circuit is provided to switch destination portions to which a boosted potential is supplied, a generation circuit for generating a boosted potential is commonly used both when writing data and when erasing data, a large generation circuit is not particularly required.

The inventors of the present application have found that the variation of the cell threshold value after erasing data can be reduced by increasing the source bias Vs in the data erasing operation.

Consequently, the distribution width of the cell threshold voltage values in the array can be reduced to be smaller by a device in which a boosted voltage as stated above is supplied to the source of the memory cell transistor during an erasing operation, thereby to eject charges from a charge store layer with use of the boosted voltage, than by a type of device in which an operating power source is used to eject charges from a charge store layer.

In addition, a switching means switches destination portions to which the boosted voltage is supplied, such that a boosted voltage is transferred to the drain of the memory cell transistor when writing data, while the boosted voltage is transferred to the source of the memory cell transistor when erasing data. Therefore, both the writing and erasing operations can be carried out by a single boost voltage generation means. Consequently, it is possible to efficiently reduce the area occupied by a chip to be smaller, without individually providing one boost voltage generation means for each of the writing and erasing operations.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENTS

In the following, the present invention will be explained with reference to drawings, exemplifying an embodiment. In the following explanation, the components or portions common in all the drawings are referred to by common reference numerals or symbols, so that the explanation of those components or potions might not be reiterated.

Figure 4:
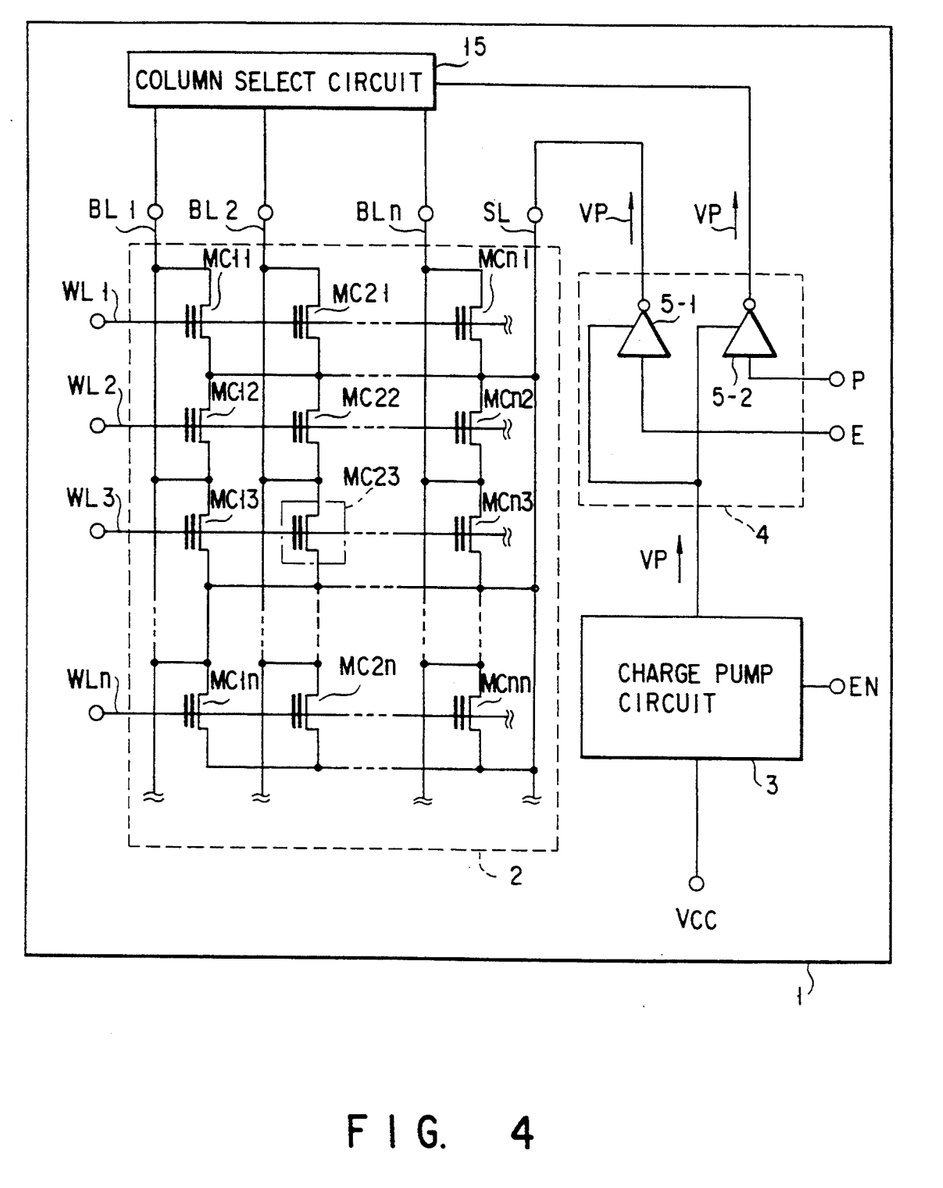
FIG. 4 is a block-diagram showing a flash EEPROM according to an embodiment of the present invention.

FIG. 4 is a view showing a structure of a flash EEPROM according to an embodiment of the present invention.

As shown in FIG. 4, a charge pump circuit 3 and a switching circuit 4 are provided in a silicon chip 1. The charge pump circuit 3 boost a source voltage VCC (e.g., 4.5 to 5 V) supplied from outside the chip 1 to a boosted voltage VP (e.g., 6.5 to 7 V) in accordance with an allowance signal EN. The switching circuit 4 supplies the boosted voltage VP generated by the charge pump circuit 3, by switching supply paths one of which leads to a source line SL and the other of which leads to one of bit lines BL1 to BLn through a column (or bit line) select circuit 15.

In a memory cell array 2, bit lines BL1 to BLn are formed and also word lines WL1 to WLn are formed in a direction perpendicular to the bit lines. Memory cell transistors MCll to MCnn are respectively provided for almost all cross-points of the bit and word lines. The drains of the cell transistors MCll to MCln adjacent to each other in the column direction are connected to the bit line BL1. In the same way, the drains of cell transistors MC21 to MC2n adjacent to each other in the column direction are connected to the bit line BL1, while the drains of cell transistors MCnl to MCnn are respectively connected to bit lines BLn. Each gate of the cell transistors MCll to MCnl provided in the row direction to be adjacent to each other is connected to the word line WL1. In the same way, each gate of the cell transistors MC12 to MCn2 is connected to the word line WL2, while each gate of the cell transistors MC13 to MCn3 is connected to the word line WL3. Gates of the cell transistors MCln to MCnn are respectively connected to word lines WLn. Each source of the cell transistors MCll to MCnn disposed like a matrix is connected to a source line SL.

An input of the charge pump circuit 3 is connected to a terminal supplied with an operating source voltage VCC, and an output of the circuit 3 is connected to a source input line of the switching circuit 4. When an allowance signal EN of an "H" or "L" level is inputted to a control input terminal, the source VCC is boosted, to generate a boosted voltage VP.

Level shifters 5-1 and 5-2 are provided in the switching circuit 4. An input of the level shifter 5-1 is connected to a first input terminal supplied with an erasure signal, and an input of the level shifter 5-2 is connected to a second input terminal supplied with a program signal P. An output of the level shifter 5-1 is connected to a source line SL, and an output of the level shifter 5-2 is connected to one of the bit lines BL1 to BLn through a column (bit line) selection circuit 15. Each of the level shifters 5-1 and 5-2 consists of a CMOS inverter which has a P-channel type MOSFET and an N-channel type MOSFET connected in series between a boosted potential (6.5 V) and a grounding potential (GND). The level shifter 5-1 supplies the boosted voltage VP for the source line SL when an erasure signal of an "L" level is inputted, while the level shifter 5-2 supplies the boosted voltage VP for the boosted voltage VP for the bit lines BL1 to BLn when a program signal P of an "L" level is inputted.

Figure 5:
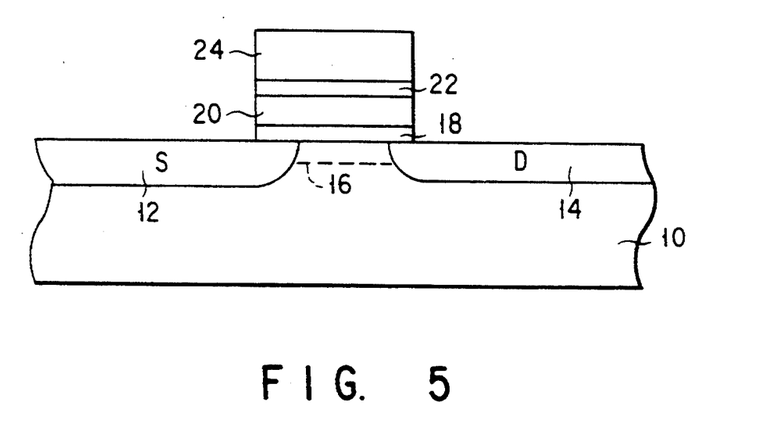
FIG. 5 is a cross-section of a memory cell transistor shown in FIG. 4.

FIG. 5 is a cross-section of the cell transistor shown in FIG. 4. In addition, FIG. 5 particularly illustrates the cell transistor MC23 among the cell transistors.

As shown in FIG. 5, a source 12 and a drain 14 are formed in a silicon substrate 10. A first gate oxide film 18 is formed on a channel 16 defined between the source 12 and the drain 14. A floating gate 20 is formed on the first gate oxide film 18, and a control gate 24 is formed on the floating gate 20 with a second insulator 22 interposed therebetween.

Next, operation will be explained.

Figure 6A:
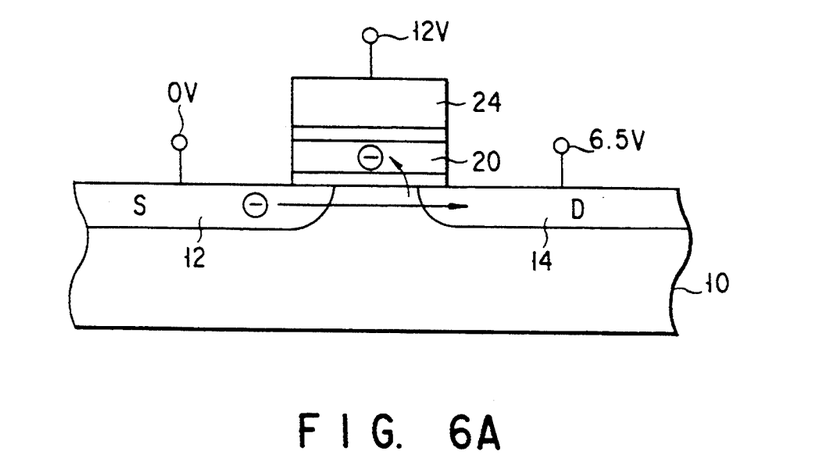
FIG. 6A is a view showing a state of a data writing operation of a flash EEPROM according to an embodiment of the present invention.
Figure 6B:
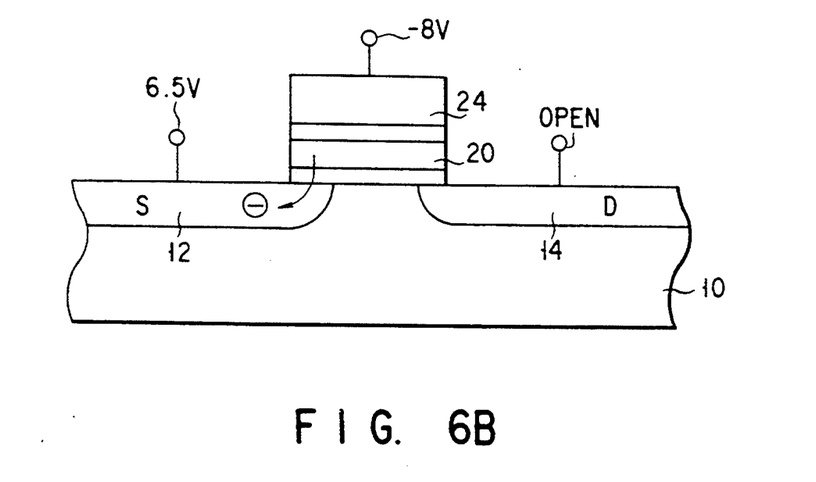
FIG. 6B is a view showing a state of a data erasing operation of a flash EEPROM according to an embodiment of the present invention.

FIGS. 6A and 6B are views showing an operating condition of a memory cell transistor having a flash EEPROM according to an embodiment of the present invention. FIG. 6A is a view showing an operating condition during a writing operation, and FIG. 6B is a view showing a condition during an erasing operation.

As shown in FIG. 6A, a gate bias Vg, a drain bias Vd, and a source bias Vs are respectively set to 12 V, 6.5 V (equal to a boosted voltage VP), and 0 V. An operating source voltage VCC is 4.5 to 5 V, and the drain bias Vd of 6.5 V is obtained by boosting the source voltage VCC (4.5 to 5 V with use of the charge pump circuit 3.

When the cell transistor is biased as shown in FIG. 6A, a current flows between the drain 14 and the source 12 of the cell transistor, thereby generating hot electrons, and a portion of the hot electrons is injected into a floating gate 20. Thus, data is written into the cell transistor.

During an erasing operation, a gate bias Vg and a source bias Vs are respectively set to −8 V and 6.5 V, and the drain is opened. During the erasing operation, the source bias Vs of 6.5 V (equal to the boosted voltage VP) is obtained by boosting the source voltage VCC (4.5 to 5 V) by the charge pump circuit 3 shown in FIG. 4. Further, the source bias Vs of 6.5 V is supplied by switching the destination portions to which the boosted voltage VP is supplied, depending on whether data is to be written or erased.

When the cell transistor is biased as shown in FIG. 6B, a high voltage is generated between the control gate 24 and the source 12 of the cell transistor, and a high electric field is applied at a portion between the floating gate 20 and the source 12 of the first gate oxide film 18. Then, an F-N tunnel current flows between the floating gate 20 and the source 12. Data is thereby erased from the cell transistor. In a flash EEPROM, this erasing operation is carried out for each cell block which is constituted by grouping several transistors.

If the boosted voltage VP is approximately 6.5 V, as stated above, a current flow of about 16 mA is sufficient for simultaneously writing data into a 32-bit cell.

In addition, if an erasing unit with which data is erased at once is set to below approximately 2 megabits, a current consumption is approximately 20 mA. Therefore, a single charge pump circuit 3 is enough to carry out both writing and erasing operations, as long as the charge pump circuit 3 has a boosting ability of 6.5 V and a current supply ability of approximately 20 mA.

In addition, in case where a voltage of 6.5 V is obtained by boosting the source voltage 4.5 V with the single use of a charge pump arranged in a one-stage structure, a capacitor having a size of about 0.5 mm square is sufficient when an oxide film of 20 nm is used, and enlargement of the chip size does not significantly matter. Specifically, the area occupied by this capacitor is about 3% or less of the area required in case where a charge pump circuit is fabricated in the flash EEPROM explained above with reference to FIGS. 2A and 2B.

In addition, when writing and erasing operations are performed with use of one single charge pump 3, currents flowing during the erasing operation and during the writing operation are preferably balanced. If currents are well-balanced, the capacitor of the charge pump circuit can be efficiently used and excessive enlargement of the chip size can be prevented. In the embodiment explained above, currents are respectively 16 mA and 20 mA during writing and erasing operations, and therefore, there is not a large difference between the currents respectively required for these two operation modes, and thus, currents are well-balanced therebetween.

Further, during an erasing operation, the distribution width of the threshold voltage values of the cell transistor in the array after the erasing operation can be reduced to be smaller than in the case where the source bias Vs is set to be equal to the operating voltage VCC, like a semiconductor memory device shown in FIGS. 3A and 3B.

With respect to the distribution width of the threshold voltage values of cell transistors in the array after an erasing operation, explanation will be made below, comparing a flash EEPROM according to an embodiment of the present invention and another flash EEPROM.

Figure 7A:
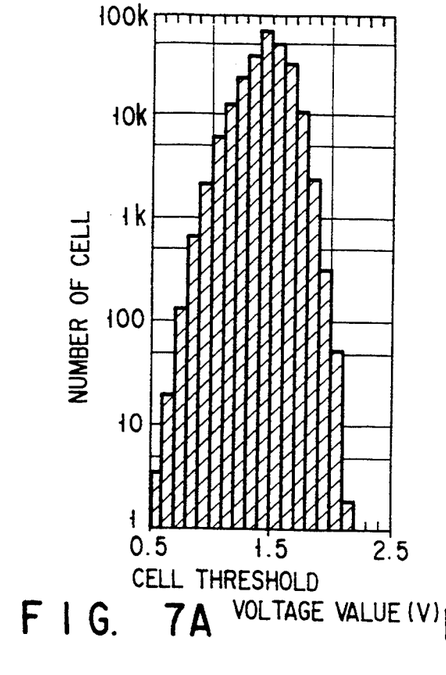
FIG. 7A is a graph showing a distribution of threshold voltage values of memory cell transistors after erasing data, in a conventional device.
Figure 7B:
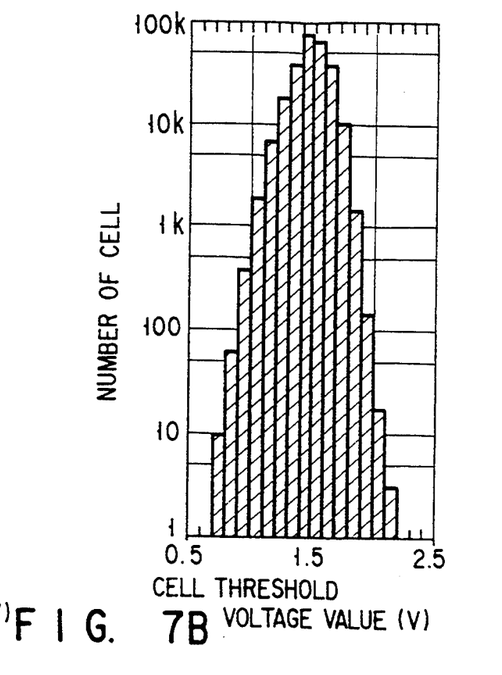
FIG. 7B is a graph showing a distribution of threshold voltage values of memory cell transistors after erasing data, in a device according to an embodiment of the present invention.

FIGS. 7A and 7B are graphs showing distributions of the threshold voltage values of cell transistors after an erasing operation. FIG. 7A shows an example of the flash EEPROM explained above with reference to FIGS. 2A and 2B, and FIG. 7B is an example of a flash EEPROM according to the embodiment of the present invention.

Distributions of the cell threshold voltage values shown in FIGS. 7A and 7B were obtained by a device set under the conditions as follows.

Test results shown in FIG. 7A were obtained by using groups of cell transistors having a channel length of 0.6 μm, in which the source bias Vs and the gate bias Vg were set respectively to 5 V (equal to the operating power source voltage VCC) and −10 V. Please note that the source bias Vs was directly led from the operating power source.

Test results shown in FIG. 7B were obtained by using groups of cell transistors having a channel length of 0.6 μm, in which the source bias and the gate bias were respectively set to 7 V and −7V. Please note that the source bias Vs was supplied from a boosted voltage which is obtained by boosting the operating source VCC (5 V) by a charge pump circuit 3. In addition, the source bias Vs was the same as that used as a drain bias Vd (7 V) applied during a writing operation.

In comparison with the device in which data was erased using a source bias Vs of 5 V (equal to VCC), as shown in FIG. 7A, and in which the distribution width of the threshold voltage values reached approximately 1.6 V, the distribution width of the threshold voltage values were reduced to approximately 1.4V in the device in which data was erased using a source bias Vs of 7 V (equal to VP), as shown in FIG. 7B. The distribution width of the latter threshold voltage values can thus be reduced by approximately 0.2 V, i.e., 12.5% of that of the former device.

Figure 8:
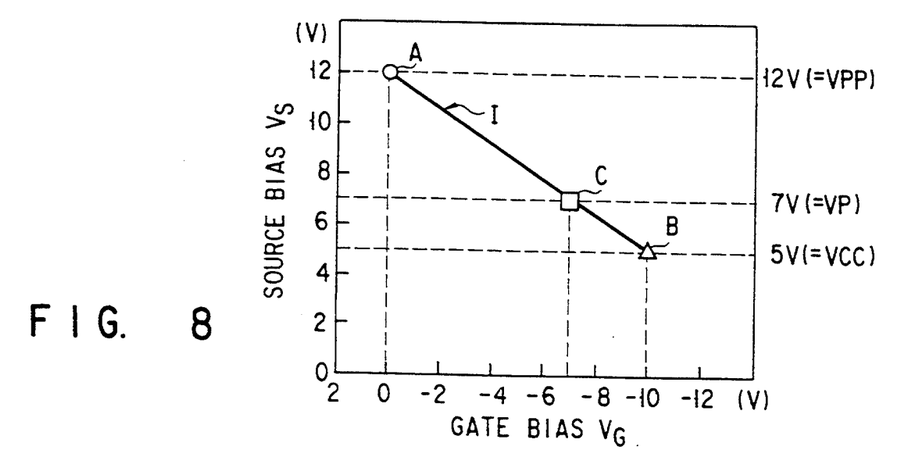
FIG. 8 is a graph showing a relationship between a source bias and a gate bias while erasing data.

FIG. 8 is a view showing a relationship between the source bias Vs and the gate bias Vg during an erasing operation.

In the semiconductor memory device according to the present invention, it is desirable that the relationship between the source bias and the gate bias Vg should be set as indicated by the line I shown in FIG. 8, for example to keep the desired erase speed. Specifically, as indicated by the line I, when the source bias Vs is decreased, the gate bias Vg should be enlarged in a negative direction, so that a sufficient voltage can be obtained between the gate and source. In this manner, electrons can sufficiently be ejected out of the floating gate.

The device which exhibited a bias state represented by the point A shown in FIG. 8 was the device which has been explained with reference to FIGS. 2A and 2B. The device which exhibited a bias state represented by the point B was the device which has been explained with reference to FIGS. 3A and 3B. Further, the device which exhibited a bias state represented by the point C was the device according to the embodiment of the present invention.

In the semiconductor memory device which has been explained as the embodiment of the present invention, a negative potential is applied to a control gate and a boosted voltage VP is applied to a source thereof, during an erasing operation. The boosted voltage VP is applied to a drain thereof during a writing operation. In this manner, an extremely large capacitor for boosting voltages needs not be mounted on a charge pump, as in the device which has been explained with reference to FIGS. 2A and 2B. The semiconductor memory device can be operated using a single operating power source, and the chip size can be reduced to be smaller.

Compared with the device which has been explained with reference to FIGS. 3A and 3B, the distribution width of the cell threshold voltage values after erasing data can be reduced to be smaller, yield and an operation margin can be improved, and costs can also be reduced. Further, since the distribution width of the cell threshold voltage values after erasing data can be decreased, it is advantageous in that the erasing speed can be shortened, thus contributing to developments of a semiconductor memory device having a higher processing ability in the future.

In addition, in the semiconductor memory device according to the above embodiment, since there is provided a switching circuit for switching the destination portions to which a boosted voltage VP obtained by a single charge pump circuit is supplied, depending on whether data is to be written or erased, a single charge pump circuit is commonly used as a charge pump circuit for obtaining a boosted voltage required for writing data and as a charge pump circuit for obtaining another boosted voltage required for erasing data. Therefore, it is not necessary to individually provide a charge pump circuit for writing data and another charge pump circuit for erasing data, and the area occupied by a chip can effectively be reduced.

The present invention is, however, not limited to the above embodiment, and various modifications can be made without deviating from the subject matter of the invention. An example of such modifications is shown in FIG. 9.

Figure 9:
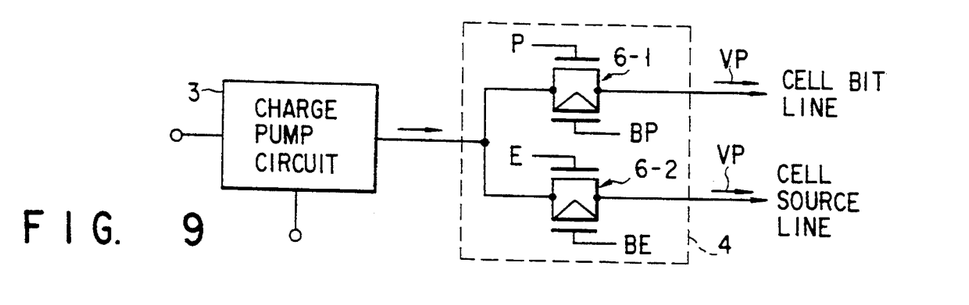
FIG. 9 is a circuit configuration showing another example of a switching circuit shown in FIG. 4.

FIG. 9 shows another example of a switching circuit 4.

As shown in FIG. 9, transfer gates 6-1 and 6-2 are provided in the switching circuit 4, and each of these gates comprises an NMOS and a PMOS.

A program signal P is supplied to an NMOS gate of the transfer gate 6-1, and an inverted signal BP of the program signal P is supplied to a PMOS gate thereof. The transfer gate 6-1 supplies a boosted potential VP to a cell bit line from a charge pump circuit 3, when the program signal P is of a "H" level.

An erasure signal E is supplied to an NMOS gate of the transfer gate 6-2, and an inverted signal BE of the erasure signal is supplied to a PMOS gate thereof. The transfer gate 6-2 supplies the boosted potential VP to a cell source line from a charge pump circuit 3 when the erasure signal is of a "H" level.

Since this switching circuit operates in the same manner as the switching circuit shown in FIG. 4, the switching circuit of FIG. 4 can be substituted for the switching circuit shown in FIG. 9.

As explained above, according to the present invention, it is possible to provided a non-volatile semiconductor memory device in which the area occupied by a chip can be reduced, and the distribution width of the cell threshold voltage values after erasing data can be reduced.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor memory device comprising:
   a semiconductor chip;
   a memory cell transistor provided in the chip and having a gate insulating film which includes a charge store layer for controlling a threshold value;
   generation means provided in the semiconductor chip, for boosting a source potential to generate a boosted potential; and
   switching means for switching destination portions to which a boosted potential is applied, depending on whether data is written or erased, such that the boosted potential is applied to a drain of the memory cell transistor from the generation means while data is written, and the boosted potential is supplied to a source of the memory cell transistor from the generation means while data is erased.

2. A semiconductor memory device according to claim 1, wherein the charge store layer is a floating gate electrode.

3. A semiconductor memory device according to claim 2, wherein a sufficiently high potential is applied to a gate of the memory cell transistor and a low potential lower than the boosted potential is applied to the source of the memory cell transistor, so that a current flows from the drain to the source to introduce hot electrons into the floating gate electrode, while data is being written into the memory cell transistor.

4. A semiconductor memory device according to claim 3, wherein the sufficiently high potential is a first positive potential, the boosted potential is a second positive potential lower than the first positive potential, and the low potential is a grounding potential.

5. A semiconductor memory device according to claim 4, wherein the first positive potential is approximately 12 V and the second positive potential is 6.5 V.

6. A semiconductor memory device according to claim 2, wherein a sufficiently low potential is applied to a gate of the memory cell transistor, and the boosted potential is applied to the source of the memory cell transistor to generate an F-N tunnel current flowing from the source to the floating gate electrode, thus extracting electrons from the floating gate electrode, when data is erased from the memory cell transistor.

7. A semiconductor memory device according to claim 6, wherein the sufficiently low potential is a negative potential.

8. A semiconductor memory device according to claim 7, wherein the negative potential is approximately $-8$ V and the boosted potential is 6.5 V.

9. A semiconductor memory device according to claim 7, wherein the negative potential is approximately $-7$ V and the boosted potential is 7 V.

10. A semiconductor memory device according to claim 1, wherein the generation means is a charge pump circuit.

11. A semiconductor memory device according to claim 10, wherein the switching means comprises a supply end to which the boosted potential is applied from the charge pump circuit, a first boosted potential discharge end connected to a source line, and a second boosted potential discharge end connected to a bit line by a column selection circuit.

* * * * *